(12) United States Patent
Yun et al.

(10) Patent No.: US 8,264,887 B2
(45) Date of Patent: Sep. 11, 2012

(54) NONVOLATILE MEMORY DEVICE AND METHOD OF PROGRAMMING THE SAME

(75) Inventors: In Suk Yun, Seoul (KR); Kee Han Rho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 316 days.

(21) Appl. No.: 12/770,021

(22) Filed: Apr. 29, 2010

(65) Prior Publication Data

US 2010/0302859 A1 Dec. 2, 2010

(30) Foreign Application Priority Data

May 29, 2009 (KR) .................. 10-2009-0047811
Jun. 29, 2009 (KR) .................. 10-2009-0058496

(51) Int. Cl.
*G11C 11/34* (2006.01)
(52) U.S. Cl. ......... 365/185.24; 365/185.27; 365/185.17; 365/226
(58) Field of Classification Search ............. 365/185.24, 365/185.27, 185.17, 210.12
See application file for complete search history.

(56) References Cited

U.S. PATENT DOCUMENTS 7,184,308 B2 * 2/2007 Kwon et al. ............. 365/185.17
2006/0120154 A1 * 6/2006 Lee ......................... 365/185.17

FOREIGN PATENT DOCUMENTS

KR 1020090007119 1/2009

OTHER PUBLICATIONS

Notice of Allowance issued from Korean Intellectual Property Office on Jan. 10, 2011.

* cited by examiner

*Primary Examiner* — Vu Le
*Assistant Examiner* — Han Yang
(74) *Attorney, Agent, or Firm* — IP & T Group LLP (57) ABSTRACT

A nonvolatile memory device includes a memory block including a number of cell strings, a channel voltage detection unit configured to detect channel voltages of the cell strings in which the channel voltages are changed based on voltages supplied to memory cells of the cell strings during a program operation and to generate channel voltage code based on an average channel voltage of the detected channel voltages, and a voltage supply unit configured to change a level of a pass voltage of the voltages supplied to memory cells in which the pass voltage is supplied to the memory cells during the program operation according to the channel voltage code.

11 Claims, 6 Drawing Sheets

NONVOLATILE MEMORY DEVICE AND METHOD OF PROGRAMMING THE SAME

CROSS-REFERENCE TO RELATED APPLICATIONS

This application claims priority from Korean Patent Application No. 10-2009-0047811 filed on May 29, 2009 and Korean Patent Application No. 10-2009-0058496 filed on Jun. 29, 2009, the disclosure of each of which is incorporated herein by reference in their entireties.

BACKGROUND OF THE INVENTION

An embodiment of the present invention relates to a nonvolatile memory device and, more particularly, to a nonvolatile memory device and a method of programming the same, which are capable of controlling a channel boosting level by controlling a pass voltage when performing a program operation.

There is an increasing demand for nonvolatile memory devices which can be electrically programmed and erased and can retain their data even without the supply of power. To develop high-capacity memory devices capable of storing a large amount of data, technology for the high integration of memory cells is being developed. For the high integration of memory cells, a memory device is proposed in which a plurality of memory cells coupled in series forms one string and a plurality of strings forms one memory cell array.

In general, a nonvolatile memory cell includes a gate in which a tunnel insulating layer, a floating gate, a dielectric layer, and a control gate are stacked over a semiconductor substrate and junction regions formed on both sides of the gate over the semiconductor substrate. When hot electrons are injected into the floating gate, a program operation is performed, and when electrons injected into the floating gate are discharged by F-N tunneling, an erase operation is performed.

Figure 1A:
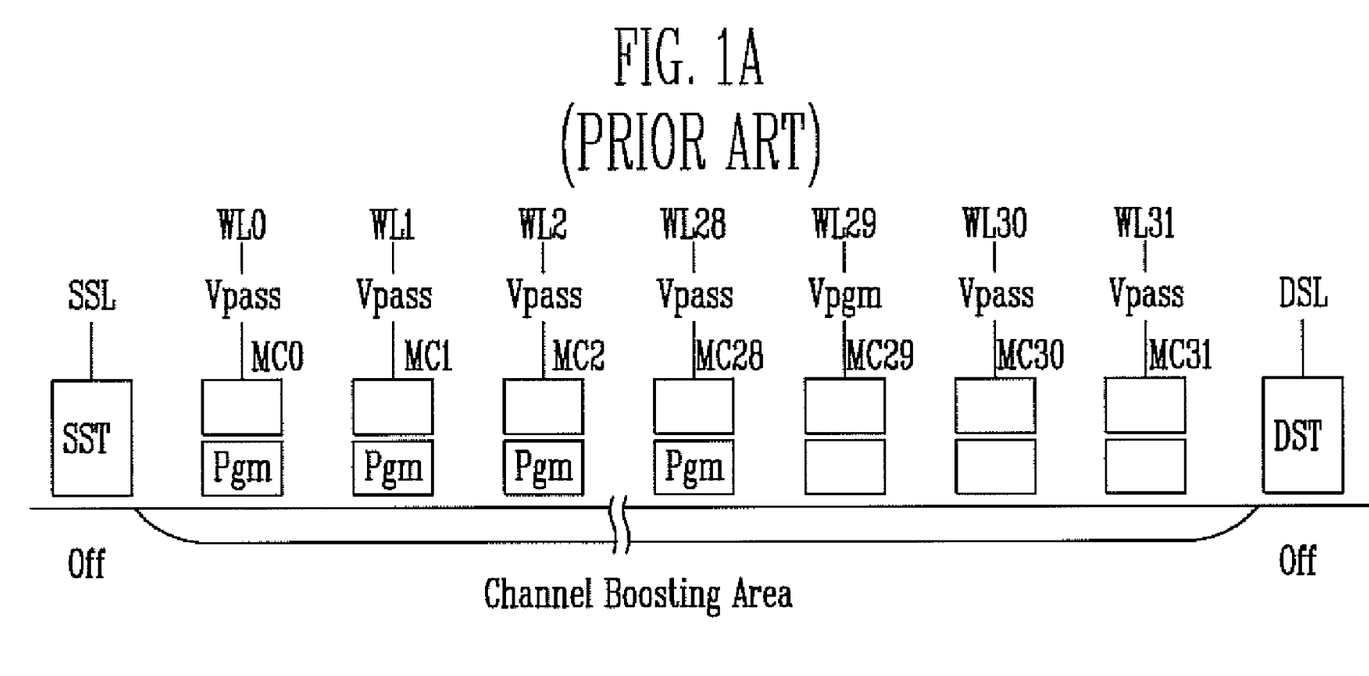
FIG. 1A is a cross-sectional view of the unit string of a nonvolatile memory device.

FIG. 1A is a cross-sectional view of a unit string of a nonvolatile memory device.

Referring to FIG. 1A, the unit string of a nonvolatile memory device includes memory cells MC0 to MC31 coupled in series between a drain select transistor DST for selecting a unit string and a source select transistor SST for selecting the ground. Each of the memory cells has a gate in which a floating gate and a control gate are stacked.

The string is coupled to a bit line BL (not shown in FIG. 1A). A number of structures, each having their string and bit lines coupled together, are coupled in parallel to form one block. The blocks are symmetrically arranged about a bit line contact. The select transistors DST and SST and the memory cells MC0 to MC31 are arranged in rows and columns in a matrix configuration. A drain select line DSL and a source select line SSL are respectively coupled to the gates of the drain select transistors DST and the gates of the source select transistors SST which are arranged in the same column. $0^{th}$ to thirty-first word lines WL0 to WL31 are respectively coupled to the gates of the memory cells MC0 to MC31 arranged in the same column. Furthermore, the bit line BL is coupled to the drain of each of the drain select transistors DST, and a common source line CSL (not shown in FIG. 1A) is coupled to the sources of the source select transistors SST.

A programming operation of the nonvolatile memory device constructed as above is described below.

To perform a program operation, a voltage of 0 V is supplied to a selected bit line, and a program voltage Vpgm is supplied to a selected word line. Accordingly, the electrons of a channel area are injected into the floating gate by Fowler-Nordheim (F-N) tunneling, which occurs due to a great difference in the voltage between the channel area and the control gate of a selected memory cell.

The program voltage Vpgm is supplied to not only the selected memory cell, but also to the unselected memory cells arranged in the same word line. Consequently, the unselected memory cells coupled to the same word line can also be programmed. This phenomenon is called program disturbance.

To prevent such program disturbance, the sources of the drain select transistors DST of strings, including unselected memory cells coupled to the selected word line and unselected bit lines, are charged to a voltage level (Vcc-Vth) (where Vcc is a power source voltage and Vth is the threshold voltage of the drain select transistor), the program voltage Vpgm is supplied to the selected word line, and a pass voltage Vpass is supplied to the unselected word lines. Accordingly, the channel voltage Vch of memory cells belonging to the same string is boosted, and that the unselected memory cells are prevented from being programmed.

For example, when the twenty-ninth word line WL29 is selected, as shown in FIG. 1A, if the program voltage Vpgm is supplied to the twenty-ninth word line WL29, the pass voltage Vpass is supplied to the remaining word lines, and the drain select transistor DST and the source select transistor SST are turned off, channel boosting occurs in the channel area of a string coupled to an unselected bit line. Accordingly, the unselected memory cells can be prevented from being programmed because a channel is formed, as shown in FIG. 1A, and a channel voltage is raised. To this end, channel boosting needs to be effectively performed.

Further, when most of the memory cells constituting a string are programmed, channel boosting is reduced. To prevent this problem, voltages can be supplied to the word lines as follows.

Figure 1B:
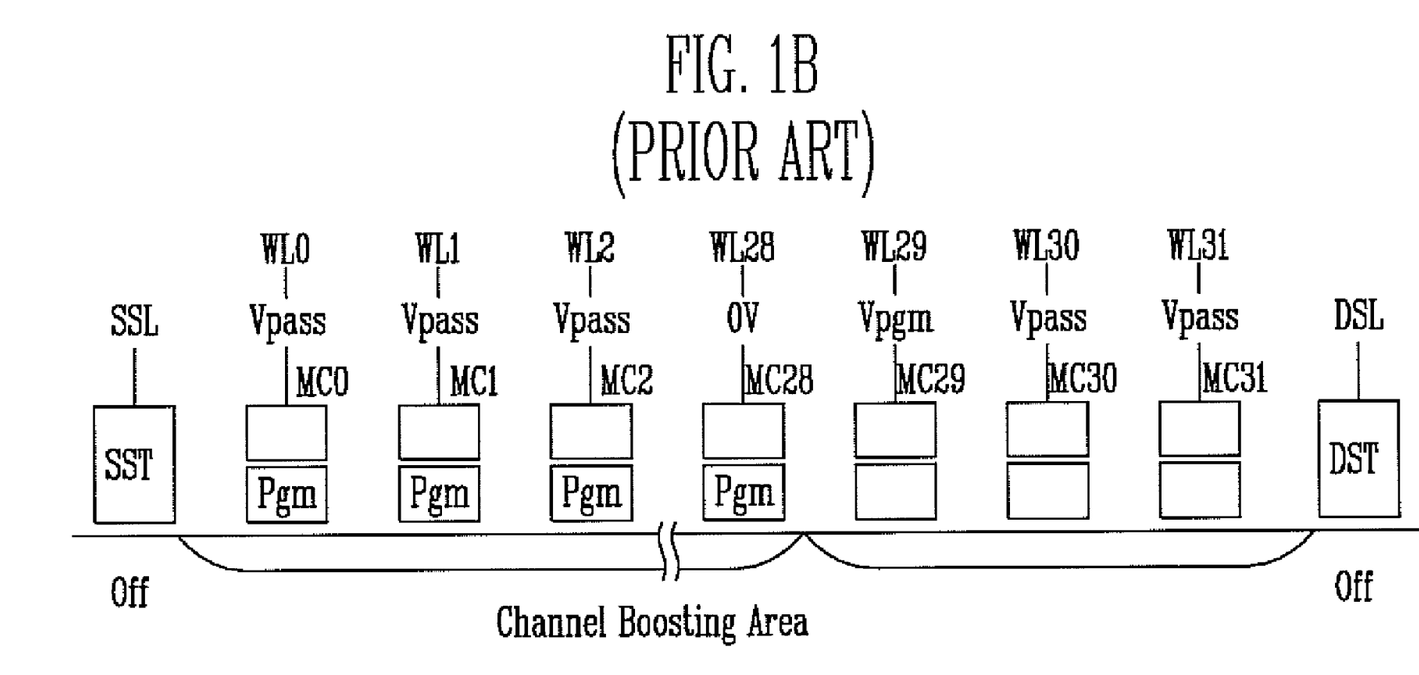
FIG. 1B is a diagram showing the supply of word line voltages according to an EASB method in the nonvolatile memory device.

FIG. 1B is a diagram illustrating the supply of voltages to word lines according to an erase area self-boosting (FASB) method in a nonvolatile memory device.

Referring to FIG. 1B, to prevent a reduction in the boosting of a programmed cell, the twenty-eighth word line WL28 (i.e., a word line on the part of the SSL line of the twenty-ninth word line WL29 for a program) is turned off, thereby forming a low channel boosting area between the $0^{th}$ and twenty-eighth word lines WL0 and WL28 and a high channel boosting area between the twenty-ninth and thirty-first word lines WL29 to WL31.

Figure 2:
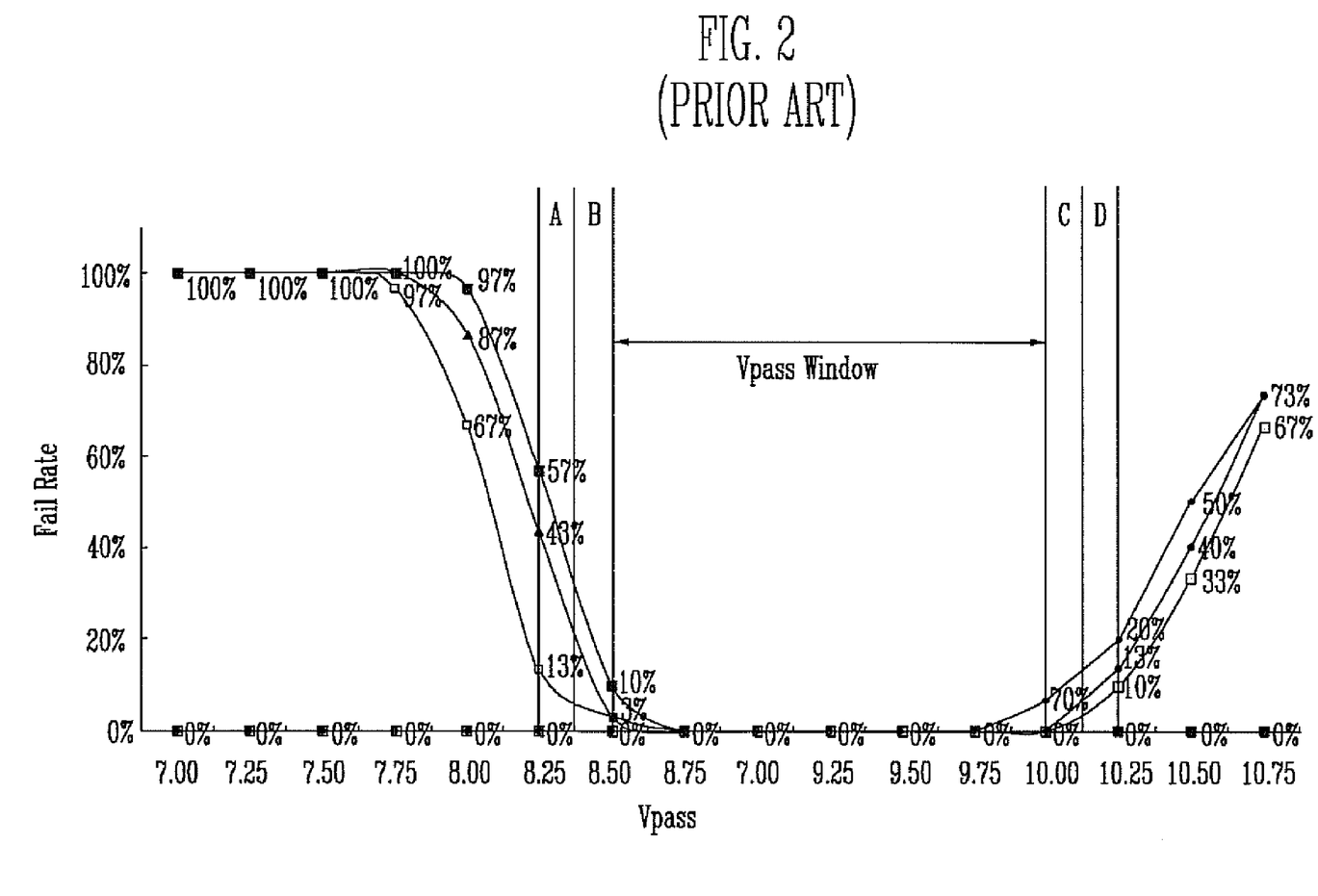
FIG. 2 is a graph showing a relationship between a channel boosting level and program disturbance.

FIG. 2 is a graph showing a relationship between a channel boosting level and a program disturbance.

Referring to FIG. 2, if the pass voltage Vpass is supplied in a time period called a pass voltage (Vpass) window, channel boosting normally occurs, and so a program disturbance does not occur. Furthermore, if the pass voltage belongs to periods A, B, and FN, a tunneling program disturbance can occur because a channel boosting level is lowered. If the pass voltage belongs to periods C and D, a program disturbance resulting from the injection of hot electrons can occur because the channel boosting level has been raised.

Accordingly, controlling the pass voltage Vpass supplied to a word line for channel boosting to prevent a program disturbance is an important factor in improving the reliability of data of a memory device.

SUMMARY OF THE INVENTION

An embodiment of the present invention relates to a nonvolatile memory device and a method of programming the same, which are capable of controlling the level of a pass voltage Vpass by checking the channel voltage of a program-inhibited cell string in real time when a program operation is being performed.

A nonvolatile memory device according to an embodiment of the present invention includes a memory block configured to include a number of cell strings, a channel voltage detection unit configured to detect channel voltages of the cell strings in which the channel voltages are changed based on voltages supplied to memory cells of the cell strings during a program operation and to generate channel voltage codes base on an average channel voltage of the detected channel voltages, and a voltage supply unit configured to change a level of a pass voltage of the voltages supplied to memory cells in which the pass voltage is supplied to the memory cells during the program operation according to the channel voltage code.

The channel voltage detection unit includes an analog to digital (A/D) converter coupled to a node of drain select transistors and the memory cells of the cell strings and configured to detect the channel voltage of the cell strings and to convert the detected channel voltage into digital data, a code conversion logic configured to generate the channel voltage codes using the digital data, and a switching element coupled between the A/D converter and the node of the drain select transistors and the memory cells and turned on or off in response to a channel voltage sense control signal.

The channel voltage detection unit is configured to detect channel voltages during a program operation in response to a first program pulse while the program operations are being performed.

The voltage supply unit includes a pass pump configured to generate a first pass voltage, and a pass voltage controller configured to change the first pass voltage to a second pass voltage in response to the channel voltage codes.

The pass voltage controller is enabled in response to a pass voltage generation enable signal following a second program pulse and changes the first pass voltage to the second pass voltage based on a resistance value changed according to the channel voltage codes.

The pass voltage controller includes a first resistor and a first transistor coupled in series between a ground node and a first node to which the first pass voltage is inputted, a second transistor, a variable resistor, and a second resistor coupled in series between the first node and the ground node, and a comparator configured to compare a reference voltage and a feedback voltage according to a resistance ratio of the variable resistor and the second resistor and to drive the first transistor according to a result of the comparison. The second transistor is driven in response to a voltage level at a node of the first resistor and the first transistor, the second pass voltage is outputted from a node of the second transistor and the second resistor, and a resistance value of the variable resistor is changed in response to the channel voltage codes.

A method of programming a nonvolatile memory device according to another embodiment of the present invention includes providing cell strings, including memory cells selected by bit lines and word lines, during a program operation in response to a first program pulse, supplying a first program voltage to a word line selected from among the word lines, and supplying a first pass voltage to remaining word lines other than the selected word line and, simultaneously, detecting a channel voltage of the cell strings, generating a control signal including channel voltage information based on the detected channel voltage, and during a program operation in response to a second program pulse, supplying a second program voltage to a word line selected from among the word lines, and supplying a second pass voltage, changed in response to the control signal, to the remaining word lines other than the selected word line.

The method further includes supplying a third program voltage to a selected word line and supplying the second pass voltage to unselected word lines during a program operation in response to a third program pulse.

The method further includes performing a verification operation after each of the program operations in response to the first to third program pulses being performed.

A method of programming a nonvolatile memory device according to yet another embodiment of the present invention includes providing cell strings including memory cells selected by bit lines and word lines, during a program operation in response to a first program pulse, supplying a first program voltage to a word line selected from among the word lines, and a first pass voltage to remaining word lines other than the selected word line and, simultaneously, detecting a channel voltage of the cell strings, generating a control signal including channel voltage information based on the detected channel voltage, during a program operation in response to a second program pulse, supplying a second program voltage to a word line selected from among the word lines, and a second pass voltage, changed in response to the control signal, to remaining word lines other than the selected word line, generating a control signal including channel voltage information based on the detected channel voltage, and during a program operation in response to a third program pulse, supplying a third program voltage to a word line selected from among the word lines, and a third pass voltage, changed in response to the control signal, to remaining word lines other than the selected word line.

The method further includes performing a verification operation after each of the program operations in response to the first to third program pulses being performed.

DESCRIPTION OF THE INVENTION

Hereinafter, an embodiment of the present invention is described in detail with reference to the accompanying drawings. The drawing figures are provided to allow those having ordinary skill in the art to understand the scope of the embodiment of the present invention.

Figure 3A:
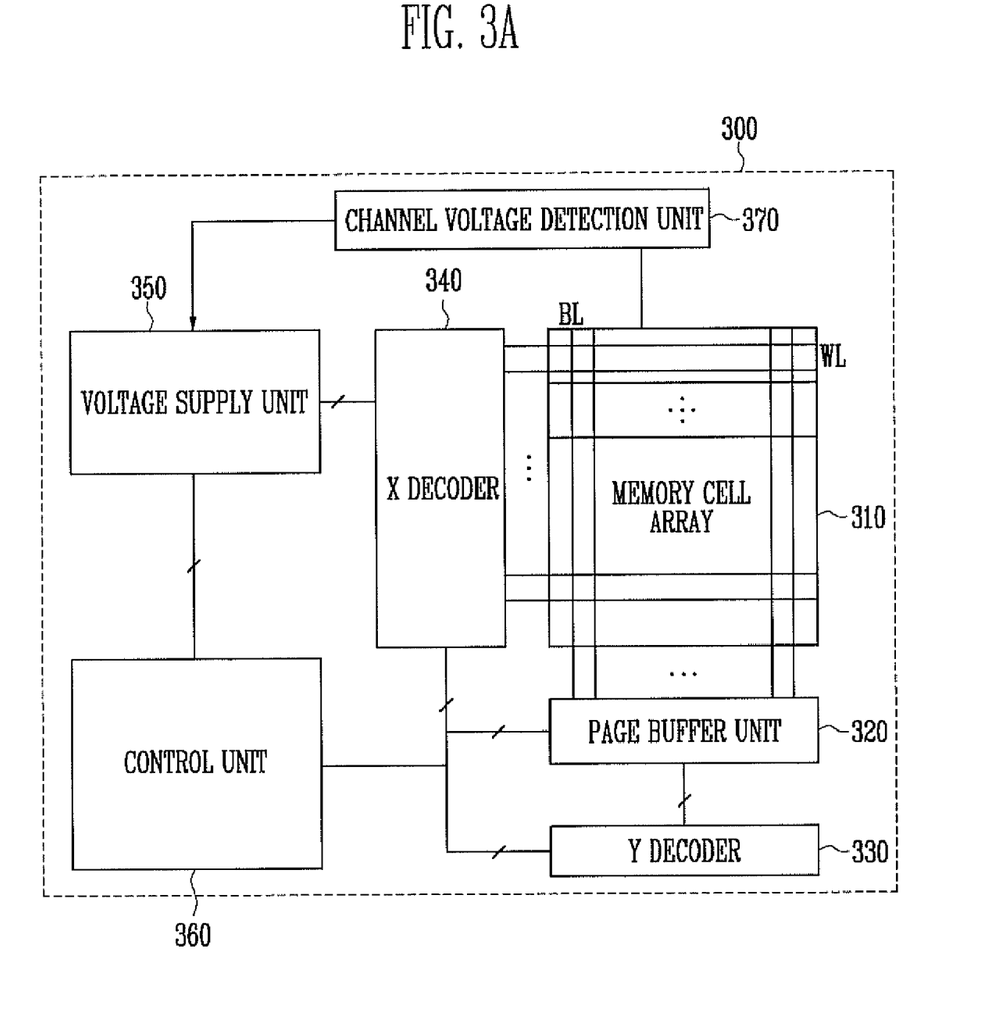
FIG. 3A is a block diagram of a nonvolatile memory device according to an embodiment of this disclosure.

FIG. 3A is a block diagram of a nonvolatile memory device according to an embodiment of the present invention.

Referring to FIG. 3A, the nonvolatile memory device 300 according to the embodiment of the present invention includes a memory cell array 310, a page buffer unit 320, a Y decoder 330, an X decoder 340, a voltage supply unit 350, a control unit 360, and a channel voltage detection unit 370.

The memory cell array 310 includes a plurality of memory blocks. Each of the memory blocks includes a number of cell strings, each of which includes memory cells coupled in series for storing data. Each of the cell strings is coupled to a bit line BL. Furthermore, the gates of the memory cells are coupled to respective word lines WL in a direction orthogonal to the bit lines BL.

The page buffer unit 320 includes a plurality of page buffers coupled to the bit lines of the memory cell array 310. Each of the page buffers temporarily stores data to be programmed into a selected memory cell and transfers the stored data to the selected memory cell through a corresponding bit line or stores data read from a memory cell.

The Y decoder 330 provides the page buffers of the page buffer unit 320 with an I/O path in response to an input address. The X decoder 340 selects a word line of the memory cell array 310 in response to an input address.

The voltage supply unit 350 generates operating voltages to be supplied to a word line coupled to the X decoder 340 under the control of the control unit 360. Furthermore, a portion of the voltage supply unit 350 generates a pass voltage Vpass and includes a pass voltage controller (not shown) to change the level of the pass voltage Vpass in response to channel voltage codes Channel Level<3:0> supplied by the channel voltage detection unit 370.

The control unit 360 outputs a control signal according to an operation command.

Furthermore, the channel voltage detection unit 370 is coupled to the cell strings of the memory block and detects an overall channel voltage and supplies the channel voltage codes Channel Level<3:0>, generated based on a result of the detection, to the voltage supply unit 350.

The channel voltage detection unit 370 is coupled to a node of the drain select transistors DST and the memory cells of the cell strings. The channel voltage detection unit 370 measures a channel voltage supplied to the cell strings and generates the channel voltage codes Channel Level<3:0> for controlling a pass voltage based on a result of the measurement.

A detailed construction of the channel voltage detection unit 370 is described below.

Figure 3B:
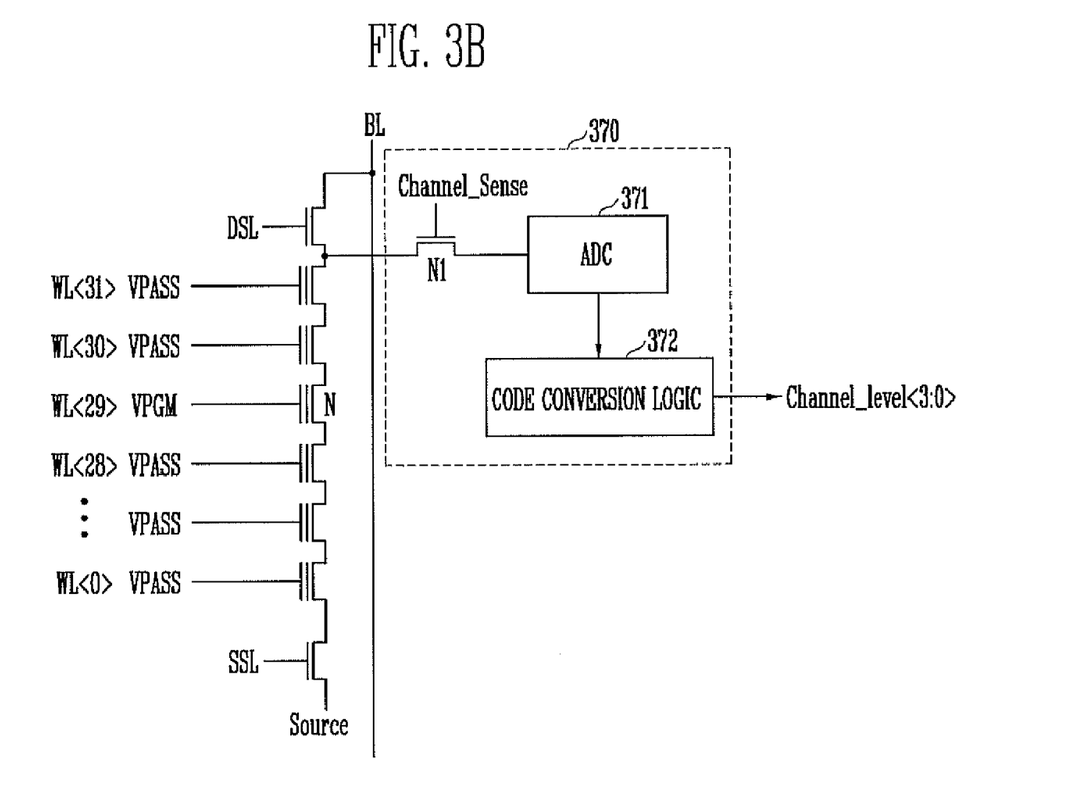
FIG. 3B is a diagram showing a channel voltage detection unit of FIG. 3A.

FIG. 3B is a diagram showing the channel voltage detection unit 370 of FIG. 3A.

In particular, FIG. 3B is a diagram showing the channel voltage detection unit 370 coupled to a channel of a cell string of the memory cell array 310.

Referring to FIG. 3B, the channel voltage detection unit 370 includes a first NMOS transistor N1, an analog digital converter (ADC) 371, and code conversion logic 372.

The first NMOS transistor N1 is coupled between the cell strings and the ADC 371. A channel voltage sense control signal Channel_Sense is inputted to the gate of the first NMOS transistor N1. The first NMOS transistor N1 is coupled to the ADC 370 and to all of the cell strings of the memory block.

When the first NMOS transistor N1 is turned on, the ADC 371 converts the channel voltage of the cell strings into digital data. The code conversion logic 372 converts the digital data, received from the ADC 371, into 4-bit channel voltage codes Channel Level<3:0>. Here, the code conversion logic 372 converts the digital data into 4-bit codes.

The pass voltage controller controls a pass voltage based on the channel voltage codes Channel Level<3:0> and is included in the voltage supply unit 350.

Figure 3C:
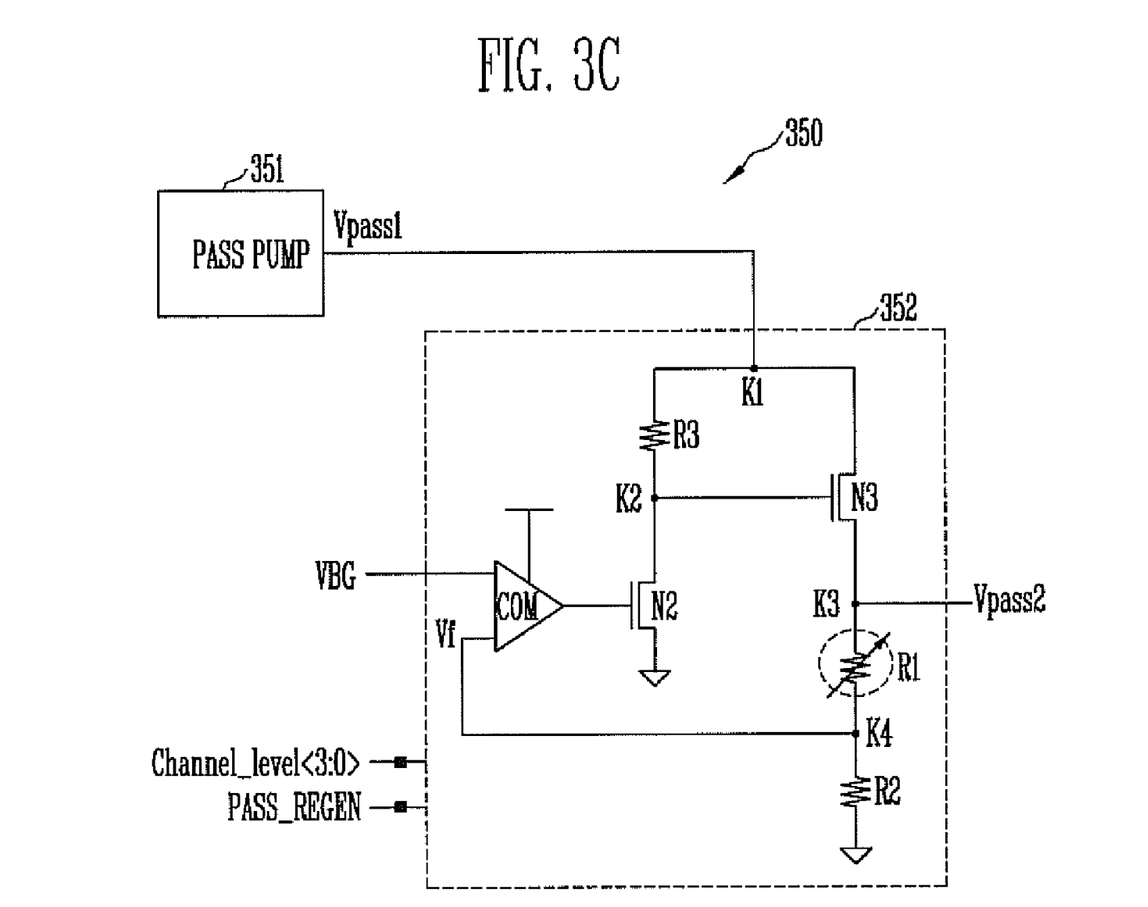
FIG. 3C is a diagram showing part of a voltage supply unit shown in FIG. 3A.

FIG. 3C is a diagram showing part of the voltage supply unit 350 shown in FIG. 3A. FIG. 3C shows only a portion for generating and outputting a pass voltage in the voltage supply unit 350.

The voltage supply unit 350 of the nonvolatile memory device 300 according to this embodiment of the present invention includes a pass voltage controller 352 and a pass pump 351 to generate a pass voltage.

The pass pump 351 generates a first pass voltage Vpass1 to be inputted to unselected word lines during a program operation. The pass voltage controller 352 changes the first pass voltage Vpass1, received from the pass pump 351, according to the channel voltage codes Channel Level<3:0> received from the channel voltage detection unit 370 and outputs a result of the change as a second pass voltage Vpass2.

The pass voltage controller 352 includes a comparator COM, first to third resistors R1 to R3, and second and third NMOS transistors N12 and N3.

The first pass voltage Vpass1 outputted from the pass pump 351 is inputted to a node K1. The third resistor R3 and the second NMOS transistor N2 are coupled in series between the node K1 and a ground node. The output signal of the comparator COM is inputted to the gate of the second NMOS transistor N2.

The comparator COM compares a reference voltage VBG and a feedback voltage Vf and outputs a result of the comparison.

The third NMOS transistor N3 and the first and second resistors R1 and R2 are coupled in series between the node K1 and the ground node. The third NMOS transistor N3 is coupled to the node K1 and a node K3 from which the second pass voltage Vpass2 is outputted. A node K2 is coupled to the gate of the third NMOS transistor N3. The node K2 is the node of the third resistor R3 and the second NMOS transistor N2.

The first resistor R1 is a trimming resistor whose resistance varies according to the channel voltage codes Channel Level<3:0>. The first resistor R1 is coupled between the node K3 and a node K4. The second resistor R2 is coupled between the node K4 and the ground node.

The feedback voltage Vf, divided by the resistance ratio of the first resistor R1 and the second resistor R2, is outputted from the node K4.

The pass voltage controller 352 is enabled in response to a pass voltage generation enable signal PASS_REGEN. As described above, the pass voltage controller 352 changes the first pass voltage Vpass1 to the second pass voltage Vpass2 in response to the channel voltage codes Channel Level<3:0> received from the channel voltage detection unit 370.

A process of generating the second pass voltage Vpass2 is described below.

A program voltage is supplied according to an increment step pulse program (ISPP) method. When a first program pulse is received, the program voltage is supplied to a selected word line, and the voltage supply unit 350 supplies the second pass voltage Vpass2 to the remaining word lines. Here, the pass voltage controller 352 is not enabled.

Accordingly, when the pass pump 351 outputs the first pass voltage Vpass1, the voltage supplied to the third resistor R3, from among the first pass voltage Vpass1 passing through the node K1, is supplied to the node K2. In response thereto, the third NMOS transistor N3 is turned on.

Further, the first pass voltage Vpass1 supplied to the node K1 is supplied to the node K3 via the third NMOS transistor N3 and then outputted as the second pass voltage Vpass2.

While a program operation is performed in response to the first program pulse, the channel voltage detection unit 370 detects the channel voltage of the cell strings, converts the detected channel voltage into digital data, and outputs a result of the conversion as the channel voltage codes Channel Level<3:0>.

Subsequently, when a program operation is performed in response to a second program pulse, the channel voltage control unit 352 is enabled. The second pass voltage Vpass2 is changed according to a resistance value of the first resistor R1 and according to the channel voltage codes Channel Level<3:0>, and is then supplied.

If, as a result of the detection by the channel voltage detection unit 370, the detected channel voltage is too low, and the pass voltage is low, then the pass voltage is controlled to be high. If the detected channel voltage is too high, the pass voltage is high, and so the pass voltage is controlled to be low.

Such control of the channel voltage is based on the pass voltage (Vpass) window obtained by checking experimental results. Thus, the channel voltage detection unit 370 is designed to generate the channel voltage codes Channel Level<3:0> capable of controlling the voltage level of a pass voltage such that the second pass voltage Vpass2 is included in the pass voltage window.

In other words, an average channel voltage is checked based on the channel voltage of all of the cell strings, and a determination is made as to whether a pass voltage occurring when the corresponding channel voltage is generated belongs to the pass voltage window, and the channel voltage codes Channel Level<3:0> capable of controlling the voltage level of a pass voltage are generated based on a result of the determination. The average channel voltage is obtained by the code conversion logic 371.

The pass voltage controller 352 of the voltage supply unit 350 controls a pass voltage in response to the channel voltage codes Channel Level<3:0> and supplies a controlled pass voltage. Accordingly, a program disturbance can be prevented, and unselected memory cells can be program-inhibited.

In another embodiment of the present invention, while a program operation is performed, a channel voltage can be detected whenever a program pulse is received. When a program operation is performed in response to a next program pulse, a pass voltage according to the detected channel voltage may be used.

That is, a pass voltage can be set by detecting a channel voltage in response to not only a first program pulse, but also in response to all program pulses. Furthermore, in a next program operation, a pass voltage is set based on a previously detected channel voltage. To this end, the channel voltage control unit 352 can be enabled to detect a channel voltage whenever a program operation is performed in response to each program pulse. Furthermore, a pass voltage is changed according to a result of detecting the channel voltage.

For example, assuming that a program pulse is supplied four times, while program operations are performed in response to the first to third program pulses, a channel voltage can be detected, and a pass voltage can be set. While program operations are performed in response to the second to fourth program pulses, program operations can be performed using respective pass voltages which have been set during the program operations for the first to third program pulses.

As described above, according to the nonvolatile memory device and the method of programming the same of this embodiment, a pass voltage Vpass is controlled by checking the channel voltage of program-inhibited cell strings in real time while a program operation is being performed. Accordingly, a program disturbance is not generated, and the reliability of data can be improved.

What is claimed is:
1. A nonvolatile memory device, comprising:
a memory block including a number of cell strings;
a channel voltage detection unit configured to detect channel voltages of the cell strings in which the channel voltages are changed based on voltages supplied to memory cells of the cell strings during a program operation and to generate channel voltage code based on an average channel voltage of the detected channel voltages; and
a voltage supply unit configured to change a level of a pass voltage of the voltages supplied to memory cells in which the pass voltage is supplied to the memory cells during the program operation according to the channel voltage code.

2. The nonvolatile memory device of claim 1, wherein the channel voltage detection unit comprises:
an analog to digital (A/D) converter coupled to a node of drain select transistors and the memory cells of the cell strings and configured to detect the channel voltage of the cell strings and to convert the detected channel voltage into digital data;
a code conversion logic configured to generate the channel voltage codes using the digital data; and
a switching element coupled between the A/D converter and the node of the drain select transistors and the memory cells and turned on or off in response to a channel voltage sense control signal.

3. The nonvolatile memory device of claim 2, wherein the channel voltage detection unit is configured to detect channel voltages during a program operation in response to a first program pulse upon the program operations being performed.

4. The nonvolatile memory device of claim 2, wherein the voltage supply unit comprises:
a pass pump configured to generate a first pass voltage; and
a pass voltage controller configured to change the first pass voltage to a second pass voltage in response to the channel voltage codes.

5. The nonvolatile memory device of claim 4, wherein the pass voltage controller is enabled in response to a pass voltage generation enable signal following a second program pulse and to change the first pass voltage to the second pass voltage based on a resistance value changed according to the channel voltage codes.

6. The nonvolatile memory device of claim 4, wherein the pass voltage controller comprises:
a first resistor and a first transistor coupled in series between a ground node and a first node to which the first pass voltage is inputted;
a second transistor, a variable resistor, and a second resistor coupled in series between the first node and the ground node; and
a comparator configured to compare a reference voltage and a feedback voltage according to a resistance ratio of the variable resistor and the second resistor and to drive the first transistor according to a result of the comparison,
wherein the second transistor is driven in response to a voltage level at a node of the first resistor and the first transistor, wherein the second pass voltage is outputted from a node of the second transistor and the second resistor, and wherein a resistance value of the variable resistor is changed in response to the channel voltage codes.

7. A method of programming a nonvolatile memory device, the method comprising:
providing cell strings including memory cells selected by bit lines and word lines;
supplying a first program voltage to a word line selected from among the word lines, and supplying a first pass voltage to remaining word lines other than the selected word line and, simultaneously, detecting a channel voltage of the cell strings, during a program operation in response to a first program pulse;

generating a control signal including channel voltage information based on the detected channel voltage; and supplying a second program voltage to a word line selected from among the word lines, and a second pass voltage, changed in response to the control signal, to remaining word lines other than the selected word line, during a program operation in response to a second program pulse.

8. The method of claim 7, further comprising supplying a third program voltage to a selected word line and supplying the second pass voltage to unselected word lines, during a program operation in response to a third program pulse.

9. The method of claim 8, further comprising performing a verification operation after each of the program operations in response to the first to third program pulses being performed.

10. A method of programming a nonvolatile memory device, the method comprising:

providing cell strings including memory cells selected by bit lines and word lines;

supplying a first program voltage to a word line selected from among the word lines, and supplying a first pass voltage to remaining word lines other than the selected word line and, simultaneously, detecting a channel voltage of the cell strings during a program operation in response to a first program pulse;

generating a control signal including channel voltage information based on the detected channel voltage;

supplying a second program voltage to a word line selected from among the word lines, and supplying a second pass voltage, changed in response to the control signal, to remaining word lines other than the selected word line during a program operation in response to a second program pulse;

generating a control signal including channel voltage information based on the detected channel voltage; and supplying a third program voltage to a word line selected from among the word lines, and supplying a third pass voltage, changed in response to the control signal, to remaining word lines other than the selected word line during a program operation in response to a third program pulse.

11. The method of claim 10, further comprising performing a verification operation after each of the program operations in response to the first to third program pulses being performed.

\* \* \* \* \*